United States Patent
Hao

(10) Patent No.: US 8,954,294 B2
(45) Date of Patent: Feb. 10, 2015

(54) MEASURING DEVICE AND MEASURING METHOD FOR CONTINUOUS PHYSICAL QUANTITY

(75) Inventor: Yushan Hao, Hebei (CN)

(73) Assignee: Baoding Sanchuan Electric Co., Ltd., Baoding, Hebei (CN)

( * ) Notice: Subject to any disclaimer, the term of this patent is extended or adjusted under 35 U.S.C. 154(b) by 447 days.

(21) Appl. No.: 13/382,918

(22) PCT Filed: Jul. 6, 2010

(86) PCT No.: PCT/CN2010/075008
§ 371 (c)(1),
(2), (4) Date: Jan. 7, 2012

(87) PCT Pub. No.: WO2011/003347
PCT Pub. Date: Jan. 13, 2011

(65) Prior Publication Data
US 2012/0109586 A1 May 3, 2012

(30) Foreign Application Priority Data
Jul. 8, 2009 (CN) .......................... 2009 1 0158375

(51) Int. Cl.
*H04B 15/00* (2006.01)
*G01D 1/00* (2006.01)
*G06F 11/30* (2006.01)
*G01R 19/25* (2006.01)

(52) U.S. Cl.
CPC .............. *G01D 1/00* (2013.01); *G01R 19/2509* (2013.01)

USPC ............ 702/195; 702/182; 702/183; 702/188

(58) Field of Classification Search
CPC .................................................. G01R 19/2509
USPC ...................... 702/182–188, 195 A
See application file for complete search history.

(56) References Cited

U.S. PATENT DOCUMENTS

2008/0204033 A1* 8/2008 Burlak et al. ................. 324/504

FOREIGN PATENT DOCUMENTS

JP     7244523    *   3/1994

OTHER PUBLICATIONS

International Search Report for PCT/CN2010/075008.*

* cited by examiner

*Primary Examiner* — Phuong Huynh
(74) *Attorney, Agent, or Firm* — Houteman Law LLC

(57) ABSTRACT

The invention discloses a measuring device and a measuring method for a continuous physical quantity. The measuring device comprises a timing unit for outputting a time base and a time scale; a sampling unit for sampling the continuous physical quantity under control of the time base and at time intervals that meet the Nyquist sampling theorem, and outputting a sampling value; a decision unit for deciding whether the sampling value turns into a transient state from a steady state or turns into the steady state from the transient state; a calculating unit for calculating a steady state value for the sampling value of the sampling unit in the steady state; and an output unit for outputting the start time of the steady state and the steady state value X, and the start time and the sampling value of the transient state according to the result of decision and the time scale. The invention may not only avoid the aliasing and but also reduce the output data volume.

16 Claims, 2 Drawing Sheets

MEASURING DEVICE AND MEASURING METHOD FOR CONTINUOUS PHYSICAL QUANTITY

FIELD OF THE INVENTION

The invention relates to a measuring and recording technology of a continuous physical quantity, particularly, to the digital measurement and recording in electric power systems such as temperature, pressure, flow, voltage, current, power, phase angle, etc.

BACKGROUND OF THE INVENTION

Invariable or less variable values of a continuous physical quantity in a long time is called as a steady state process; and the transition between two steady state processes within a short time is called as a transient state process. The physical quantity of a process which consists of the steady state process and the transient state process is sampled according to the Nyquist's sampling theorem (also known as the Shannon's theorem), and the sampling time intervals are less than a half of a minimum time constant Tc in the transient state process. There would be too more data to be transmitted in remote automations, if the data were sampled according to the sampling theorem.

In practice, a sampling time interval T is artificially specified in remote automations, and only the data which are on time points of integral multiple of the interval T are recorded or transmitted as shown in FIG. 1. Obviously, the T can not meet the sampling theorem, so that the aliasing is generated, the state and the variability of a physical process can not be correctly reflected by the recorded or transmitted data.

Even if the measured data are replaced by mean values within the time interval T, the fault of the sampled data can not be solved with aliasing generated, but also extra errors will be generated, so that a product relationship no longer exists in the mean value of three quantities in which the product is originally equal to the product of two quantities, e.g. the variable quantities A, B and C, wherein $A=B \cdot C$, $B=\overline{B}+\Delta b$, $C=\overline{C}+\Delta c$, $\overline{A} \neq \overline{B} \cdot \overline{C}$.

SUMMARY OF THE INVENTION

The present invention aims at solving at least the contradictions between the sampling theorem and practices.

Therefore, embodiments of the present invention provide a measuring device and a measuring method of a continuous physical quantity, which can not only reduce the output or transmitted data volume but also exactly measure the data and avoid aliasing.

According to an aspect of the present invention, the embodiments of the present invention provide the measuring device of a continuous physical quantity, which comprises a timing unit for outputting a time base and a time scale; a sampling unit for sampling the continuous physical quantity under the control of the time base and at time intervals that meet the Nyquist sampling theorem and outputting a sampling value $x_k$; a decision unit for deciding whether the sampling value $x_k$ turns into a transient state process from a steady state process or turns into the steady state process from the transient state process; a calculating unit for calculating a steady state value X from the sampling value out of the sampling unit in the steady state process; and an output unit for outputting the start time of the steady state process and the steady state value X, and the start time and the sampling values $x_k$ of the transient state process according to the result of deciding and the time scale.

According to the further embodiments of the present invention, t-distribution of a statistics method or a filter is used in the decision unit.

According to the further embodiments of the present invention, the measuring device comprises a preprocessing unit for performing scale transform, bad data removal, resample and/or root-mean-square (RMS) calculation to the sampling value of the sampling unit.

According to the further embodiments of the present invention, the calculating unit is used for calculating the steady state value according to mean value algorithms or low pass filters.

According to the further embodiments of the present invention, the measuring device further comprises a recording unit for recording the start time of the steady state process, the start time of the transient state process, the corresponding steady state value before the start time of the transient state process and the sampling values of the transient state process.

According to another aspect of the present invention, the embodiments of the present invention provide the measuring method for the continuous physical quantity, which comprises the steps of: sampling the continuous physical quantity under the control of the time base output by a timer and at time intervals that meet the Nyquist sampling theorem and outputting the sampling value $x_k$ and the time scale; deciding whether the sampling value $x_k$ turns into the transient state process from the steady state process or turns into the steady state process from the transient state process; and outputting the start time of the steady state process and the steady state value X obtained by calculating the sampling value in the steady state process, and the start time and the sampling value $x_k$ of the transient state process according to the result of deciding and the time scale.

According to the further embodiments of the present invention, the steady state value X is calculated by mean value algorithms or low pass filters.

According to the further embodiments of the present invention, the step of deciding comprises the steps of: calculating a mean value $\overline{x}_k$ and a variance $\hat{S}_k$, which correspond to the sampling value $x_k$; deciding whether $(x_k-\overline{x}_k)/\hat{S}_k$ obeys t-distribution; deciding that the sampling value $x_k$ does not turn into the transient state process from the steady state process or turns into the steady state process from the transient state process if the $(x_k-\overline{x}_k)/\hat{S}_k$ obeys the t distribution; and deciding that the $x_k$ turns into the transient state process from the steady state process or does not turn into the steady state process from the transient state process if the $(x_k-\overline{x}_k)/\hat{S}_k$ does not obey t-distribution. The t distribution can be decided according to the following formula: $|x_k-\overline{x}_k| \leq t_{\alpha/2}(k-1) \cdot \hat{s}_k/\sqrt{k}$, where k is the numbers of the sampling values, $\alpha$ is a risk coefficient which is generally set out about 0.05.

According to the further embodiments of the present invention, the deciding step comprises the steps of: calculating the mean value $\overline{x}_k$ and the variance $\hat{S}_k$ from the sampling value $x_k$; deciding whether $|x_k-\overline{x}_k| \leq A \cdot \hat{s}_k$ is valid, where A is a set coefficient which is generally within the range 3-10; deciding that the sampling value $x_k$ does not turn into the transient state process from the steady state process or the sampling value $x_k$ turns into the steady state process from the transient state process if the $|x_k-\overline{x}_k| \leq A \cdot \hat{s}_k$ is valid; and deciding that the sampling value $x_k$ turns into the transient state process from the steady state process or the sampling value $x_k$ does not turn into the steady state process from the transient state process if the $|x_k-\overline{x}_k| \leq A \cdot \hat{s}_k$ is invalid.

According to the further embodiments of the present invention, the step of deciding comprises the steps of: calculating the mean value $\bar{x}_k$ which corresponds to the sampling value $x_k$; deciding whether $|x_k - \bar{x}_k| \leq \delta \cdot x_r$ is valid, where $\delta$ is a given value which is generally within the range of 2%-10%, and $X_r$ is a rated value which corresponds to the continuous physical quantity; deciding that the sampling value $x_k$ does not turn into the transient state process from the steady state process or the sampling value $x_k$ turns into the steady state process from the transient state process if the $|x_k - \bar{x}_k| \leq \delta \cdot x_r$ is valid; and deciding that the sampling value $x_k$ turns into the transient state process from the steady state process or the sampling value $x_k$ does not turn into the steady state process from the transient state process if the $|x_k - \bar{x}_k| \leq \delta \cdot x_r$ is invalid.

According to the further embodiments of the present invention, the step of deciding comprises the steps of: filtering the sampling value $x_k$ to obtain the filtered components of the sampling value $x_k$ respectively; respectively deciding whether the filtered components exceed a correspondingly-set upper limit value; deciding that the sampling value $x_k$ does not turn into the transient state process from the steady state process if the filtered components do not exceed the correspondingly-set upper limit value; and deciding that the sampling value $x_k$ has entered into the transient state process from the steady state process if one filtered component exceeds the upper limit value.

According to the further embodiments of the present invention, the step of deciding comprises the steps of: filtering the sampling value $x_k$ to obtain the filtered components of the sampling value $x_k$ respectively; respectively deciding whether the filtered components exceed a correspondingly-set lower limit value; deciding that the sampling value $x_k$ does not turn into the steady state process from the transient state process if one filtered component exceeds the correspondingly-set lower limit value; and deciding that the sampling value $x_k$ does not enter into the steady state process from the transient state process if the filtered components do not exceed the lower limit value.

According to the further embodiments of the present invention, the method further comprises a processing step for performing scale transform, bad data removal, resample and/or effective value calculation to the sampling value $x_k$.

According to the further embodiments of the present invention, the method further comprises a step for recording the start time of the steady state process, the start time of the transient state process, the corresponding steady state value before the start time of the transient state process and the sampling values of the transient state process.

The present invention can greatly reduce the volume of output or transmitted data, prevent the data from being aliased, improve the measuring accuracy, and guarantee the data output or recorded truly.

Further aspects and advantages of the present invention will be given in the following description. They will become apparent from either the following description or the implementation of the present invention.

BRIEF DESCRIPTION OF THE DRAWINGS

The above and/or further aspects and advantages will be more apparent from the following description of embodiments with reference to the figures, in which.

DETAILED DESCRIPTION OF PREFERRED EMBODIMENTS

Figure 1:
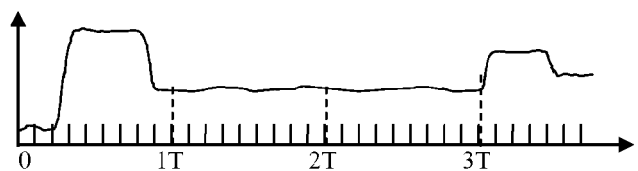
FIG. 1 is a diagram showing the sampling and the outputting of a continuous physical quantity in practices.

The embodiments of the present invention will be detailed in the following. The exemplary embodiments are illustrated in the figures, throughout which same or similar reference numerals refer to same or similar elements or to elements having same or similar functions. The following embodiments described with reference to the figures are exemplary only for explaining, rather than limiting the present invention.

Figure 2:
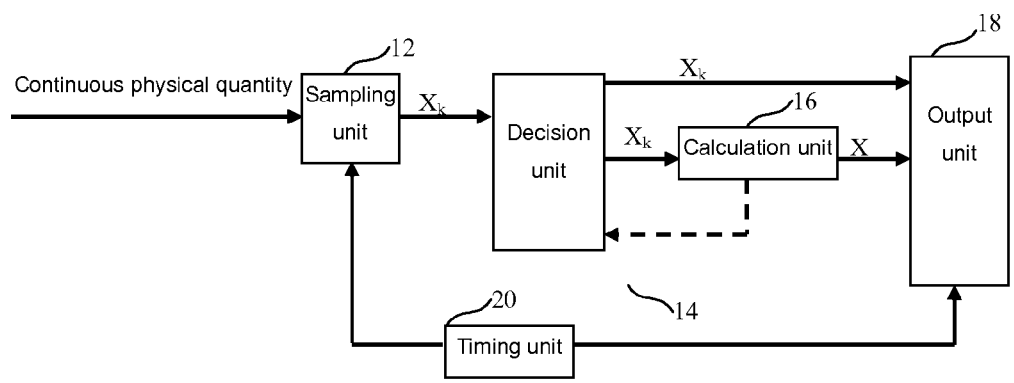
FIG. 2 is a diagram showing the structure of a measuring device for the continuous physical quantity according to the embodiments of the present invention.

FIG. 2 is the diagram showing the structure of the measuring device for the continuous physical quantity according to embodiments of the present invention. As shown in FIG. 2, the measuring device comprises a timing unit 20, a sampling unit 12, a decision unit 14, a calculating unit 16 and an output unit 18. The timing unit 20 is used to output a time base (a timed reference signal) and a time scale (generally known as year, month, day, hour, minute and second) to timestamp the sampling unit. The sampling unit 12 can be used for sampling the continuous physical quantity under the control of the time base output by the timing unit 20 and at time intervals $\Delta t$, wherein $\Delta t$ meets the Nyquist sampling theorem.

In order to simplify the calculation of a sinusoidal quantity, the sampling (such as the sampling under the control of the output of a phase locked loop) is performed according to an equal angle $\Delta\Phi$, wherein the relationship is maintained between the $\Delta\Phi$ and the $\Delta t$, so that the sampling is regarded as the variety of the sampling, and the variety also is well known.

The sampling unit 12 is used for outputting the continuously-obtained sampling value $x_k$ to the decision unit 14, and the decision unit 14 is used for deciding whether each sampling value $x_k$ turns into the transient state process from the steady state process or turns into the steady state process from the transient state process.

In one embodiment, the decision unit 14 can be used for deciding whether the sampling value $x_k$ turns into the transient state process from the steady state process or turns into the steady state process from the transient state process according to a statistical method.

If the process is steady and random, the sampling value $x_k$ is within $3\sigma$ in the probability of 99.7% due to a random factor; and $(x-\bar{X})/\hat{S}$ obeys the t distribution if X obeys the normal distribution. (Referring to the higher education edition <Probability Theory and Mathematical Statistics> published by the Zhejiang University and the second edition <Probability Theory and Mathematical Statistics> published by Mao Shiyu in the China Statistics Publishing House). During the measurement, $\bar{x}$ and $\hat{S}$ are recurring, so that the data $x_k$ can be decided whether belongs to the steady state or not at the kth time.

In the embodiments of the present invention, the sampling value $x_k$ output by the sampling unit can be recurred by the decision unit 14 to obtain the corresponding mean value $\bar{x}_k$ and variance $\hat{S}_k$, so that the sampling value $x_k$ can be decided whether to turn into the transient state/steady state process from the steady state/transient state process or turn into the steady state/transient state process from the transient state/steady state process.

Specifically, the sampling value $x_k$ is decided not to turn into the transient state process from the steady state process or decided to turn into the steady state process from the transient state process if $(x_k - \bar{x}_k)/\hat{S}_k$ obeys the t distribution; and the sampling value X is decided to turn into the transient state process from the steady state process or decided not to turn into the steady state process from the transient state process if $(x_k - \bar{x}_k)/\hat{S}_k$ does not obey the t distribution.

In one embodiment, the decision unit 14 can be used for deciding whether the sampling value turns into the transient state process from the steady state process or turns into the steady state process from the transient state process according to a filter. Herein, the filter can be one of first order or higher order (such as a second-order filter, a theird-order filter and the like) such as an nth-order kalman filter, etc.

The decision unit 14 can be used for filtering the sampling value $x_k$ to obtain the filtered components from the sampling value $x_k$. Obviously, the different filtered components can be obtained for the different-order filter. Herein, the present invention is not limited to the specific filtered components, and any available filers can be within the protection range of the present invention.

The decision unit 14 is used for deciding whether the obtained filtered components exceed a correspondingly-set upper limit respectively; deciding that the sampling value $x_k$ does not turn into the transient state process from the steady state process, i.e. does not leave the steady state process if none of the filtered components exceeds the correspondingly-set upper limit; and deciding that the sampling value $x_k$ does not turn into the transient state process from the steady state process, i.e. leaves the steady state process if any one of the filtered components exceeds the correspondingly-set upper limit.

Similarly, the sampling value $x_k$ can be used to decide if the process has turned into the steady state from the transient state by respectively deciding whether the filtered components exceed the correspondingly-set lower limit. Specifically, the sampling value $x_k$ is decided not to turn into the steady state process if any one of the filtered components exceeds the lower limit; and the sampling value $x_k$ is decided to turn into the steady state process if none of the filtered components exceeds the lower limit.

Therefore, the decision unit 14 is used for deciding whether the new data is still about a relatively-steady numerical value or into the transient state process from the steady state process due to a sudden change.

The decision unit 14 feeds the sampling value $x_k$ to the calculating unit 16 when the sampling value is decided not left the steady state process or not turned into the steady state process from the transient state process. The calculating unit 16 is used for calculating the sampling value of the sampling unit 12 by means of steady state value in the steady state process. For the continuous physical quantity, the characteristics of the steady state can be represented by a value X such as the mean value. The sampling value $x_k$ of the transient state process is directly input into the output unit 18 by the decision unit 14.

The calculating unit 16 can be used for calculating the steady state value of the output sampling value which corresponds to the steady state process according to a mean value algorithm or a low pass filtering algorithm. The steady state value X is obtained by the mean value algorithm or the low pass filtering algorithm within the steady state time intervals to avoid the random disturbance and improve the measurement precision.

In one embodiment, a mean value algorithm formula which corresponds to the steady state value X can be represented by $\bar{x}_k = [(k-1) \cdot \bar{x}_{k-1} + x_k]/k$ for instance, where $x_k$ represents the sampling values obtained in the steady state process, k represents the number of the sampling values, and $\bar{x}_k$ is the steady state value X obtained by calculating sampling values. $\bar{x}_1 = x_1$ if k is equal to 1.

In one embodiment, the steady state value X can be calculated according to a recursive algorithm of the low pass filter such as the first-order low pass filtering algorithm which is represented by the formula of $\bar{x}_k = \alpha \cdot \bar{x}_{k-1} + (1-\alpha) \cdot x_k$, where $\alpha$ is a set constant which is relevant to a time constant of the physical quantity.

Obviously, the skilled in the art can know that the steady state value X can be further obtained by the calculating unit 16 by a weighted mean value algorithm or a higher-order (such as second-order, third-order and the like) filter or the other mean value algorithms. The present invention is not limited to the specific mentioned embodiments.

For the recursive algorithm for calculating the steady state value X. In the steady state process, the current steady state value X is modified by the calculating unit 16 by a new sampling value to obtain a new steady state value X which represents the steady state process. Herein, the modification of the X is as the same as the calculation thereof, is obtained by the sampling data within the time intervals in the current steady state process, and only further comprises the new data $x_k$.

In the embodiment where the t distribution of the statistical method is used, the algorithm of the mean value $\bar{x}_k$ and the variance $\hat{S}_k$ required by the decision unit 14 can be as the same as that of the steady state value X calculated by the calculating unit 16. Therefore, the decision unit 14 can be used for outputting the sampling value $x_k$ of the sampling unit 12 to the calculating unit 16, wherein the corresponding mean value and variance calculated by the recurrence of the calculating unit 16 can be returned to the decision unit 14 along the dotted-line arrowhead as shown in the figure. The mean value calculated by the calculating unit 16 is taken as a new steady state value X of the current steady state process if the decision unit 14 decides that the state of the sampling value $x_k$ is invariable in the steady state process based on the value returned from the calculating unit 16 in combination with the specific t distribution. The mean value calculated by the calculating unit 16 is taken as an invalid value if the state of the sampling value $x_k$ is decided to be changed in the steady state process.

The output unit 18 is used for outputting the start time of the steady state process and the steady state value X which corresponds to the steady state process, and the start time of the transient state process and the sampling value $x_k$ which corresponds to the transient state process based on the result decided by the decision unit 14 in combination with the time scale output by the timing unit 20. Obviously, the start time of the transient state process also is the end time of the adjoining previous steady state process, and the start time of the steady state process is the end time of the adjoining previous transient state process.

Specifically, for the continuous physical quantity, the size of the steady state value which corresponds to the sampled data in the steady state process is represented by a value X from the calculating unit 16 if the decision unit 14 decides that the continuous physical quantity is in the steady state process rather than the transient state process formerly. The sampling unit 12 is used for obtaining a new sampling data $x_k$ in a sampling time intervals; and the decision unit 14 is used for deciding if the $x_k$ is still in the steady state process; the X is modified by the calculating unit 16 by the $x_k$, and the steady state process is continued if the $x_k$ is still in the steady state process; and the $x_k$ turns into the transient state process from the steady state process if the $x_k$ is not in the steady state process, so that the end time of the steady state process (i.e. the time when the $x_k$ turns into the start time of the transient state process) and the steady state value of the steady state process are output by the output unit 18, and the $x_k$ is taken as the sampling date of the transient state process to be output.

Furthermore, the decision unit 14 is used for deciding whether the new data $x_k$ turns into the steady state process if the continuous physical quantity is in the transient state process rather than the steady state process formerly; the current state is continued if the new data $x_k$ does not turn into the steady state process, and the decision unit 14 is used for outputting the sampling value $x_k$ to the output value 18; otherwise, the output unit 18 is used for outputting the start time of the steady state process (i.e. the end time of the transient state process), and the calculating unit 16 is used for taking the $x_k$ as the initial steady state data of the steady state process to create a new steady state value X which corresponds to the steady state process; and the steps are continued in this way.

In the embodiment where the t distribution of the statistical method is used in the decision unit 14, the algorithm of the mean value $\bar{x}_k$ required by the decision unit 14 can be as the same as that of the steady state value X calculated by the calculating unit 16. Therefore, the decision unit 14 can be used for outputting the sampling value $x_k$ from the sampling unit 12 to the calculating unit 16 directly, wherein the corresponding mean value and variance calculated by the recurrence of the calculating unit 16 can be returned to the decision unit 14 along the dotted-line arrowhead as shown in the figure.

The decision unit 14 is used for deciding if the sampling value $x_k$ turns between the steady state process and the transient state process according to the value returned by the calculating unit 16 in combination with the t distribution. If the sampling value $x_k$ does not turn into the transient state process from the steady state process, the mean value calculated by the calculating unit 16 is taken as the current steady state value of the steady state process, and the steady state value X is output to the output unit 18. If the sampling value $x_k$ is decided to turn into the steady state process from the transient state process, the sampling value $x_k$ is taken as the initial steady state data of the steady state process and is output to the calculating unit 16 so as to build the new steady state value X which corresponds to the steady state process.

The sampling value $x_k$ is taken as the initial transient state data of the transient state process, and the transient state data is provided to the output unit 18 and to the calculating unit 16 so as to calculate the mean value and the variance, which correspond to the transient state data in the transient state process, if the sampling value $x_k$ is decided to turn into the transient state process from the steady state process. The calculating unit 16 is used for returning the calculated mean value and variance to the decision unit 14 as a deciding basis of the new sampling data. The sampling value $x_k$ is continuously provided to the calculating unit 16 to calculate the mean value and the variance of the current transient state data in an updating way if the sampling value $x_k$ is decided not to turn into the steady state process from the transient state process, so that the basis for deciding the current t distribution of the decision unit 14 is updated.

The output unit 18 can be used for only outputting the corresponding steady state stat value X when the steady state process is ended according to the decision of the decision unit 14 or outputting the steady state values at different time points in the steady state process according to the remote need.

In one embodiment, the measuring device of the present invention can further comprise a recording unit (not shown in the figures) for recording the start time of each steady state process (corresponds to the end time of a transient state process), the start time of the transient state process (corresponds to the end time of a steady state process), the steady state value of the adjoining previous steady state process before the start time of a new transient state process, and the sampling value in the transient state process.

Figure 3:
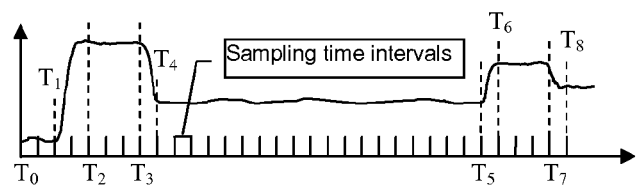
FIG. 3 is a diagram showing the measurement of the data and the time scale in a steady state process and a transient state process according to the embodiments of the present invention.

For example, the steady state process and the transient state process of the continuous physical quantity sampled as shown in FIG. 3 can be output according to the mode to obtain the data as follows:

T0, {X1}, T1, {$x_k$}, T2, {X2}, T3, {$x_k$}, ...,

Wherein, {X1}, {X2} ... are respectively to be the steady state value which corresponds to each steady state process, and the steady state value output in each steady state process can be a set of steady state value at different time points as shown mentioned above. T0 (t=o), T1, T2 ... are represented to be a series of time scales which correspond to the start time of the corresponding steady state process and the start time of the corresponding transient state process, wherein {$x_k$} is the corresponding sampling values of a series of X in each transient state process.

The recording data of recording unit can be as follows: T0, X1, T1, {$x_k$}, T2, X2, T3, {$x_k$}, ..., recorded as {Dq}-all state record. Herein, X1 and X2 are respectively to be a steady state value which corresponds to the end time of each steady state process.

In the case of the transient state process at the beginning, the corresponding output is as follows: T0, {$x_k$}, T1, {X1}, T2, {$x_k$}, T3, {X2}, ..., which is another representation of the output which corresponds to the steady state process and the transient state process, and is substantially as the same as the embodiment as shown in FIG. 3.

Generally, compared with prior art, i.e the volume of the data obtained interval T by interval T (a multiple of T are in the same steady state process), the volume of the output and recorded steady state data is less, and the aliasing fault is avoided. Furthermore, the steady state data of the present invention really reflects the characteristics of a system at that time, and can be taken as the inerrant input calculated by a subsequent system.

As the duration of the steady state is much longer than the transient state, the output or transmitted data is greatly reduced. Furthermore, signals are guaranteed to be truly recorded. Obviously, an original signal also can be restored easily by the recorded data.

If only considering the steady state value, i.e. the measurement in the steady state process, the output can not include a sampling data set {$x_k$} which corresponds to the transient state process, and the output data is as follows:
T0, {X1}, T1, T2, {X2}, T3, ..., are recorded as steady state output.

If only considering the transient state, i.e. the measurement in the transient state process, the output can not include a steady state value X which corresponds to the steady state process, but: T0, {$x_k$}, T1, T2, {$x_k$}, T3, ..., are recorded as transient state output.

In one embodiment, the measuring device further comprises a processing unit (which is not shown in the figures) for processing the sampling values output by the sampling unit 12 and directly or indirectly by means of resample outputting to the calculating unit 16. Generally, the step of processing comprises the scale transform, the bad data removal, the calculation which converts the sampling value to a effective value for the sinusoidal quantity such as the alternating voltage, the alternating current, the alternating power and the like, and the resample of RMS according to an actual system. Under the circumstances, the output of the processing unit is the re-sampled effective value.

Figure 4:
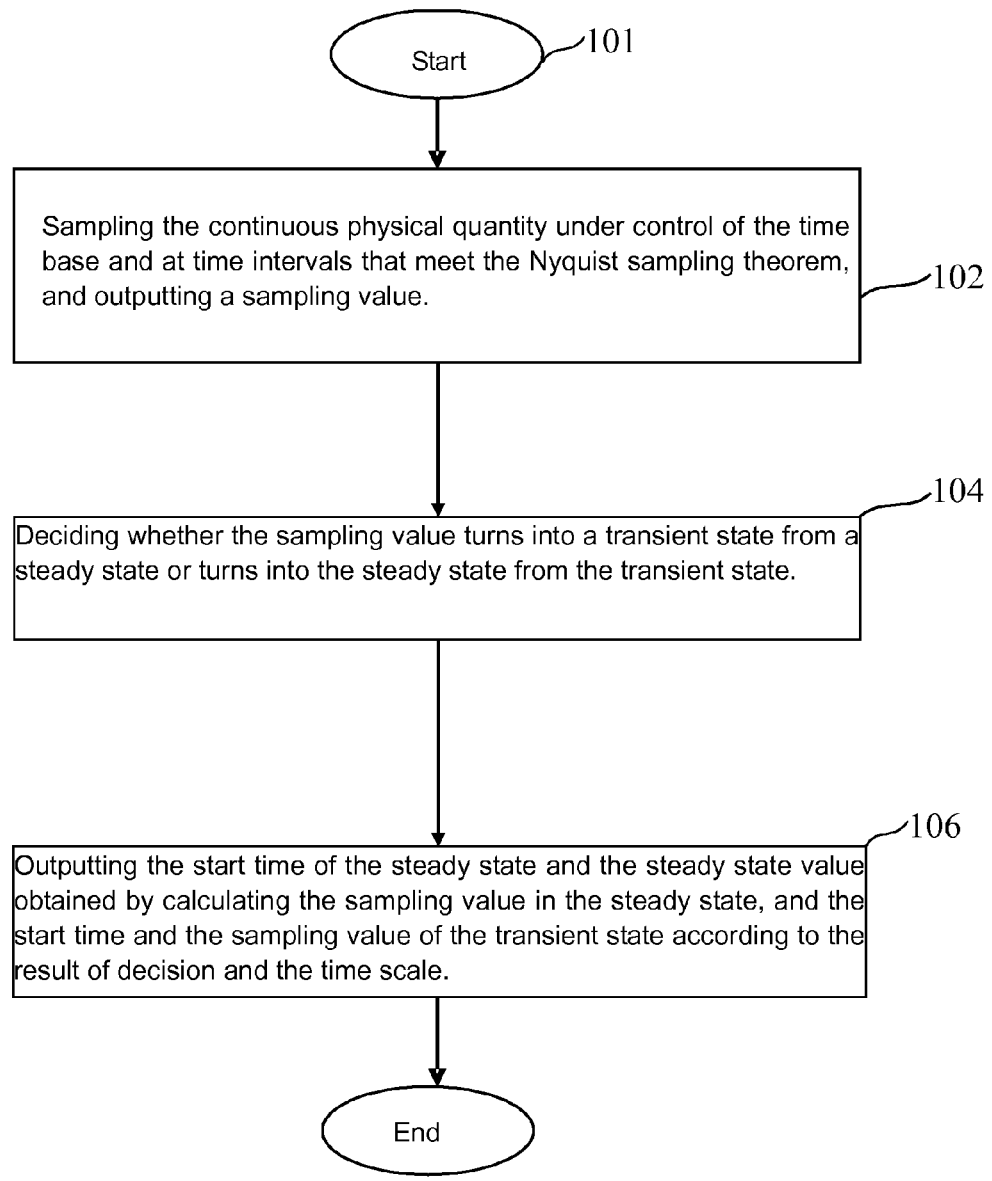
FIG. 4 is a flowchart illustrating a measuring method for the continuous physical quantity according to the embodiments of the present invention.

Now in reference to FIG. 4, the figure is the flowchart illustrating the measuring method for the continuous physical quantity according to the embodiments of the present invention.

Firstly, a continuous physical quantity is sampled under the control of the time base output by the timer according to the preset time intervals $\Delta t$, and the sampling value and the corresponding time scale are respectively output (step 102), wherein $\Delta t$ meets the Nyquist sampling theorem, and the time scale is output by the timer. The timer correspondingly gives the corresponding time scale when each time base is output, so that the sampling time which corresponds to each sampling value can be determined according to the time base. Then, the sampling value is decided whether turns into the transient state process from the steady state process or turns into the steady state process from the transient state process (step 104), and the start time and the end time of the steady state process and the steady state value obtained by calculating the sampling value in the steady state process are output according to the corresponding result of decision and the time scale (step 106).

In one embodiment, the step 104 the t distribution of the statistical method is used to decide whether the sampling value turns into the transient state process from the steady state process or turns into the steady state process from the transient state process.

For the t distribution of the statistical method: in the variance analysis, the sampling value is within the $3\sigma$ in the probability of 99.7% due to influence of a random factor if the process is steady and random. In reality, if the $\sigma$ is unknown it is replaced by $\hat{S}$ and $(x-\overline{X})/\hat{S}$ obeys the t distribution. During the measurement, $\overline{x}$ and $\hat{S}$ are recurred, so that the data $x_k$ can be decided to whether belong to the steady state or not at the Kth time.

In the embodiments of the present invention, the output sampling value $x_k$ in a sampling way can be recurred to obtain the mean value $\overline{x}_k$ and the variance $\hat{S}_k$, which correspond to the sampling value $x_k$.

For example, the corresponding mean value and variance are obtained according to a mean value formula: $\overline{x}_k=[(k-1)\cdot\overline{x}_{k-1}+x_k)]/k$ and a variance formula: $\hat{s}_k^2=(k-2)\hat{s}_{k-1}^2/(k-1)+(\overline{x}_k-\overline{x}_{k-1})^2+(\overline{x}-x_k)^2/(k-1)$, where k is the number of the sampling value which corresponds to the steady state process or the transient state process.

Therefore, the sampling value $x_k$ can be decided to whether turn into the transient state/steady state process from the steady state/transient state process or into the steady state/transient state process from the transient state/steady state process by deciding if $(x_k-\overline{x}_k)/\hat{S}_k$ obeys the t distribution.

Specifically, the sampling value $x_k$ is decided not to turn into the transient state process from the steady state process or decided to turn into the steady state process from the transient state process if $(x_k-\overline{x}_k)/\hat{S}_k$ is decided to obey the t distribution; and the sampling value $x_k$ is decided to turn into the transient state process from the steady state process or decided not to turn into the steady state process from the transient state process if $(x_k-\overline{x}_k)/\hat{S}_k$ is decided not to obey the t distribution.

Therefore, $(x-\overline{x})/(\hat{s}/\sqrt{k})\sim t(k-1)$ in one embodiment, and the t distribution can be decided according to the decision formula: $|x_k-\overline{x}_k|\le t_{\alpha/2}(k-1)\cdot\hat{s}_k/\sqrt{k}$, where $\alpha$ is a given risk coefficient, and the value of the $\alpha$ is about 0.05. The $x_k$ obeys the t distribution if the formula is valid, otherwise does not.

1) For the output $x_k$ by means of sampling and in preprocessing;
2) $\overline{x}_1=x_1$ and $\hat{s}_1^2=0$ if k=1;
Otherwise, $\overline{x}_k$ and $\hat{s}_k^2$ are calculated according to the formula above mentioned; and
3) The process is steady state if $|x_k-\overline{x}|\le t_{\alpha/2}(k-1)\cdot\hat{s}_k/\sqrt{k}$ is valid. $x_k$ is represented not to turn into the transient state process from the steady state process, i.e. not to leave the steady state process or turns into the steady state process from the transient state process, i.e. leave the transient state process, and the steady state value $X=\overline{x}_k$.

Under the circumstances that $x_k$ does not leave the steady state process, let k equals to k+1, and the next sampling value is continuously decided according to the step 2 and the step 3; and under the circumstances that $x_k$ turns into the steady state process, let k equals to 1, $x_k$ is taken as initial steady state data X1 of the steady state process, the time scale is output, then the mentioned steps are repeated.

Otherwise, $x_k$ is represented to turn into the transient state process from the steady state process or not into the steady state process from the transient state process.

Under the circumstances that $x_k$ turns into the transient state process, $x_k$ is taken as initial transient state data X1 of the transient state process, let k equals to k, and the next sampling value is continuously decided according to the step 2 and the step 3; and under the circumstances that $x_k$ does not leave the transient state process, let k equals to k+1, and the step 2 and the step 3 are repeated.

In one embodiment, the criterion of the t distribution also can be simplified as $|x_k-\overline{x}_k|\le A\cdot\hat{s}_k$, where A is a given constant such as in range of 3 to 10. Or, the criterion of the t distribution further can be simplified as $|x_k-\overline{x}_k|\le\Delta$, and $\Delta=\delta\cdot x_r$, where $\delta$ is a given constant, is generally in the range from 2% to 20% according to the precision requirement, and optionally about 5%, and $X_r$ is a rated value which corresponds to the continuous physical quantity to be measured.

Furthermore, in the deciding of the step 3), the start time of the steady state process is recorded and is initialized to be 0 if the initially-measured (t=o) sampling value X1 is decided to be a steady state process.

Obviously, the other statistical methods such as the Gaussian distribution and the like further can be used to decide the steady state process of the sampling value $x_k$, and the present invention is not limited to the embodiments above mentioned.

In one embodiment, a filtering method can be used to decide whether the sampling value turns into or leaves the steady state process. Herein, the filtering method may be any filtering algorithm of first-order or higher-order (such as second-order, third-order and the like) such as the nth-order Kalman filter, etc.

The sampling value $x_k$ is filtered, so that the filtered components which correspond to the sampling value $x_k$ can be obtained. Obviously, the numbers of the obtained filtered components are different for the filtering algorithm with different orders. Herein, the present invention is not limited to specific numbers of the filtered components, and any available filtering algorithms also belong to the protection range of the present invention.

The obtained filtered components are respectively decided if exceed the correspondingly-set upper limit value. The sampling value $x_k$ is decided not to turn into the transient state process from the steady state process, i.e. not to leave the steady state process, if none of the filtered components exceeds the correspondingly-set upper limit value; and the sampling value $x_k$ is decided to turn into the transient state process from the steady state process, i.e. to leave the steady state process, if any one of filtered components exceeds the correspondingly-set upper limit value.

Similarly, the sampling value $x_k$ may be decided if it turns into the steady state process from the transient state process by respectively deciding whether the filtered components exceed the correspondingly-set lower limit value. Specifically, the sampling value $x_k$ is decided not to turn into the steady state process if any one of filtered components exceeds the lower limit value; and the sampling value $x_k$ is decided to turn into the steady state process if none of the filtered components exceeds the lower limit value.

Obviously, the other available methods may be used in the present invention for deciding whether the sampling value $x_k$ turns into or leaves the steady state/transient state process.

Therefore, a new date can be decided whether to be still about the relatively-steady numerical value or turn into the transient state process due to the mutation which exceeds the steady state process.

The steady state value of the sampling value $x_k$ is calculated when this sampling value is decided not to leave the steady state process or the sampling value to turn into the steady state process from the transient state process. The size of a continuous physical quantity in the steady state process can be represented by one value X such as the mean value. The sampling value of the continuous physical quantity in the transient state process can be directly output.

Herein, the mean value algorithm or the low pass filtering algorithm can be used to calculate the steady state value X which corresponds to the output sampling value in a steady state process in order to avoid the random interference and improve the measuring precision.

In one embodiment, for example, the formula of the mean value algorithm for the steady state value X is represented to be $\bar{x}_k=[(k-1)\cdot\bar{x}_{k-1}+x_k]/k$, where $x_k$ represents the sampling value obtained in the steady state process, k represents the number of the sampling values, and $\bar{x}_k$ is the calculated steady state value X according to the sampling values. $\bar{x}_1=x_1$ when $k=1$.

In one embodiment, the steady state value X can be calculated according to the recursive algorithm of the low pass filter such as the first-order low pass filtering algorithm which is represented to be $\bar{x}_k=\alpha\cdot\bar{x}_{k-1}+(1-\alpha)\cdot x_k$ by the formula, wherein α is the given constant.

Obviously, the skilled in the art knows that the steady state value X can be further obtained by a higher-order (such as second-order, third-order and the like) filter or the other mean value algorithms. The present invention is not limited to the specific embodiments mentioned above.

In the embodiments where the t distribution of the statistical method is used for deciding, the calculating method of the mean value $\bar{x}_k$ may be as the same as that of the steady state value X.

For the recursive algorithm used to calculate the steady state value X, the current steady state value X is modified by a new sampling value $x_k$ to obtain the new steady state value X which corresponds to the steady state process.

The start time of the steady state process and the steady state value X are output, and the start time of the transient state process and the sampling value $x_k$ which corresponds to the transient state process are output according to the result of decision in combination with the time base output by the timer. Obviously, the start time of the transient state process is the same as the end time of the adjoining previous steady state process, and the end time of the steady state process is the same as the end time of the adjoining previous transient state process.

Specifically, the value X is calculated to represent the size of the steady state value which corresponds to the sampled data in the steady state process if a continuous physical quantity is decided to be in the steady state process formerly. A new sampling data $x_k$ is obtained after a time interval; the $x_k$ is decided whether still in the steady state process, if yes, the X is modified by the $x_k$, and the steady state process is continued; and if no, the end time of the steady state process (i.e. the start time that the $x_k$ turns into the transient state process) and the steady state value X of the steady state process are output, and the $x_k$ is taken as the sampling date of the transient state process for outputting.

Furthermore, a new data $x_k$ is decided whether to turn into a steady state process if the continuous physical quantity is in the transient state process rather than the steady state process formerly; if no, the current state is continued, and the sampling value $x_k$ is output; if yes, the start time scale of the steady state process (i.e. the end time of the transient state process) is output, and the $x_k$ is taken as the steady state data to create the new steady state value X which corresponds to the steady state process; and the steps are continued in this way.

For outputting the steady state value, only the corresponding steady state value X at end of the steady state process may be output according to the result of decision. If remote needed, the steady state value X at different time points in the steady state process may be output.

In one embodiment, the method of the present invention further comprises a step of recording to record the start time of the steady state process (the same as the end time of the transient state process), the start time of the transient state process (the same as the end time of the steady state process), the steady state value of the adjoining previous steady state process before the new transient state process is started, and the sampling value in the transient state process.

Compared with practices, i.e the volume of the data obtained interval T by interval T (a multiple of T are in the same steady state process), the volume of the output and recorded steady state data in the present invention is less, and the aliasing fault is avoided. Furthermore, the steady state data really reflects the characteristics of a system at that time, so that the steady state data can be taken as the inerrant input calculated by a subsequent system.

As the duration of the steady state is much longer than the transient state, the output or transmitted data is greatly reduced. Furthermore, signals are guaranteed to be truly recorded. Of cause, an original signal also can be restored easily by the recorded data.

In one embodiment, the method further comprises a step of preprocessing to preprocess the sampling value, and directly or indirectly by means of resample outputting for the subsequent decision and calculation. Generally, the step of preprocessing comprises scale transform, bad data removal, and effective value calculation for the sinusoidal quantity such as voltage, current, power and the like. Under the circumstances, the output sampling value is RMS.

It should be pointed out that, for a polling system, e.g. under the circumstance that the data needs to be output at a sampling terminal by one time at the specified time intervals t (e.g. t=3 seconds in an automatic power dispatching system) or at the specified time (e.g. each quarter when each hour is started in an electric monitoring system), the measuring device and the measuring method of the present invention can not directly output the start time scale and the end time scale of the steady state process, i.e. the time scale is not explicit in the outputting but being hidden in the polling. The correspondingly-required steady state value X is only needed to be output when the output data is in the steady state process. The modification also belongs to the range of protections of the present invention.

The present invention can be used for measuring and recording temperature, pressure, flow, voltage, current, power, phase angle and the like in electric power systems in order to really and clearly reflect the change of the system parameters and greatly reduce the volume of the recorded and output data.

While the embodiments of the present invention have been explained and described, various changes, modifications, alternatives and variants can be made to the embodiments by those skilled in the art without departing from the principle and spirit of the present invention. The scope of the present invention is only defined by the claims as attached and the equivalents thereof.

What is claimed is:

1. A measuring device for a continuous physical quantity, comprising:
   a timing unit for outputting a time base and a time scale;
   a sampling unit for sampling the continuous physical quantity under the control of the time base and at time intervals that meet the Nyquist sampling theorem, and outputting a sampling value $x_k$;
   a decision unit for deciding whether the sampling value $x_k$ turns into a transient state process from a steady state process or turns into the steady state process from the transient state process;
   a calculating unit for calculating a steady value X for the sampling value of the sampling unit in the steady state process; and
   an output unit for outputting the steady value X in steady states.

2. The measuring device according to claim 1, further comprising: a preprocessing unit for performing scale conversion, bad data removal, resample and/or effective value calculation to the sampling value from the sampling unit.

3. The measuring device according to claim 1, wherein the calculating unit is used for calculating the steady state value according to a mean value or a low pass filter.

4. The measuring device according to claim 1, further comprising:
   a recording unit for recording the start time of the steady state process, the start time of the transient state process, the corresponding steady state value before the start time of the transient state process and the sampling value of the transient state process.

5. The measuring device according to claim 1, wherein the output unit outputs the steady state value X with its start time in steady states.

6. The measuring device according to claim 1, wherein the output unit outputs the sampling value $x_k$ with its start time in transient states.

7. The measuring device according to claim 1, wherein the output unit outputs the steady state value X with its start time in steady states and the sampling value $x_k$ with its start time in transient states.

8. A measuring method for the continuous physical quantity, comprising the steps of:
   sampling the continuous physical quantity by a sampling unit under the control of the time base output by a timer and at time intervals that meet the Nyquist sampling theorem and outputting the sampling value $x_k$ and the time scale;
   deciding by a decision unit whether the sampling value $x_k$ turns into the transient state process from the steady state process or turns into the steady state process from the transient state process; and
   outputting by an output unit the steady state value X and the start time of the steady state process obtained by calculating the sampling value in the steady state process, and the sampling value $x_k$ and the start time of the transient state process according to the result of decision and the time scale.

9. The measuring method according to claim 8, wherein the steady state value X is calculated by a calculating unit according to the mean value or the low pass filter.

10. The measuring method according to claim 8, wherein the step of deciding comprises: calculating a mean value $\bar{x}_k$ by the decision unit and a variance $\hat{S}_k$, which correspond to the sampling value $x_k$; deciding whether $(x_k-\bar{x}_k)/\hat{S}_k$ obeys the t distribution by the decision unit, i.e., $|x_k-\bar{x}_k| \leq t_{\alpha/2}(k-1) \cdot \hat{s}_k/\sqrt{k}$, where $\alpha$ is a risk coefficient;
   If yes, deciding that the sampling value $x_k$ does not turn into the transient state process from the steady state process or turns into the steady state process from the transient state process; and
   If no, deciding that the $x_k$ turns into the transient state process from the steady state process or does not turn into the steady state process from the transient state process.

11. The measuring method according to claim 8, wherein the step of deciding comprises:
   calculating the mean value $\bar{x}_k$ and the variance $\hat{S}_k$ by the decision unit, which correspond to the sampling value $x_k$; and
   deciding whether $|x_k-\bar{x}_k| \leq A \cdot \hat{s}_k$ is valid by the decision unit, where A is a given value;
   if yes, deciding that the sampling value $x_k$ does not turn into the transient state process from the steady state process or turns into the steady state process from the transient state process; and
   if no, deciding that the sampling value $x_k$ turns into the transient state process from the steady state process or does not turn into the steady state process from the transient state process.

12. The measuring method according to claim 8, wherein the step of deciding comprises:
   calculating the mean value $\bar{x}_k$ by the calculating unit which corresponds to the sampling value $x_k$;
   deciding whether $|x_k-\bar{x}_k| \leq \delta \cdot x_r$ is valid by the decide unit, where $\delta$ is a given value, and $X_r$ is a rated value of the continuous physical quantity;
   if yes, deciding that the sampling value $x_k$ does not turn into the transient state process from the steady state process or the sampling value $x_k$ turns into the steady state process from the transient state process i; and
   if no, deciding that the sampling value $x_k$ turns into the transient state process from the steady state process or the sampling value $x_k$ does not turn into the steady state process from the transient state process.

13. The measuring method according to claim 8, wherein the step of deciding comprises:
   filtering the sampling value $x_k$ by the sampling unit to obtain the filtered components of the sampling value $x_k$ respectively; and
   respectively deciding whether the filtered components exceed a correspondingly-set upper limit value;
   deciding that the sampling value $x_k$ does not turn into the transient state process from the steady state process by the sampling unit if none of the filtered components does not exceed the correspondingly-set upper limit value; and deciding that the sampling value $x_k$ enters into the transient state process from the steady state process if any one of filtered components exceeds the upper limit value.

14. The measuring method according to claim 8, wherein the step of deciding comprises:

filtering the sampling value $x_k$ by the sampling unit to obtain the filtered components of the sampling value $x_k$ respectively; and respectively deciding whether the filtered components exceed a correspondingly-set lower limit value;

deciding that the sampling value $x_k$ does not turn into the steady state process from the transient state process by the sampling unit if any one of the filtered components exceeds the correspondingly-set lower limit value; and deciding that the sampling value $x_k$ does not enter into the steady state process from the transient state process if none of the filtered components exceeds the lower limit value.

15. The measuring method according to claim 8, further comprising a step of:

preprocessing for performing scale conversion, bad data removal, resample and/or effective value calculation to the sampling value $x_k$ by a preprocessing unit.

16. The measuring method according to claim 8, further comprising a step of:

recording the start time of the steady state process, the start time of the transient state process, the corresponding steady state value before the start time of the transient state process and the sampling value of the transient state process by a recording unit.

* * * * *